(12) United States Patent
Tang et al.

(10) Patent No.: US 12,262,609 B2
(45) Date of Patent: Mar. 25, 2025

(54) DISPLAY SUBSTRATE, MANUFACTURING METHOD AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Xia Tang, Beijing (CN); Yue Wei, Beijing (CN); Huimin Cao, Beijing (CN); Xijie Peng, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 441 days.

(21) Appl. No.: 17/784,425

(22) PCT Filed: Jun. 15, 2021

(86) PCT No.: PCT/CN2021/100059
§ 371 (c)(1),
(2) Date: Jun. 10, 2022

(87) PCT Pub. No.: WO2021/254317
PCT Pub. Date: Dec. 23, 2021

(65) Prior Publication Data
US 2023/0006024 A1 Jan. 5, 2023

(30) Foreign Application Priority Data
Jun. 15, 2020 (CN) .......................... 202010542855.2

(51) Int. Cl.
*H10K 59/131* (2023.01)
*H10K 59/12* (2023.01)
(Continued)

(52) U.S. Cl.
CPC ........... *H10K 59/131* (2023.02); *H10K 71/00* (2023.02); *H10K 59/1201* (2023.02); *H10K 59/124* (2023.02)

(58) Field of Classification Search
CPC .. H10K 59/131; H10K 71/00; H10K 59/1201; H10K 59/124
See application file for complete search history.

(56) References Cited

U.S. PATENT DOCUMENTS 10,916,615 B1    2/2021   Hu et al.
11,355,568 B2 *  6/2022   Ka ..................... H01L 27/1218
(Continued)

FOREIGN PATENT DOCUMENTS

| CN | 107300996 A | 10/2017 |
| CN | 110767738 A | 2/2020 |
| CN | 111653594 A | 9/2020 |

OTHER PUBLICATIONS

PCT/CN2021/100059 international search report and written opinion.

*Primary Examiner* — J. E. Schoenholtz
(74) *Attorney, Agent, or Firm* — IPro, PLLC

(57) ABSTRACT

The present disclosure provides a display substrate, a manufacturing method thereof, and a display device, and relates to the field of display technology. The display substrate includes a display region and a wiring region surrounding the display region. The wiring region includes: a gate line layer including a plurality of signal lines parallel to each other; an insulation layer covering the gate line layer, a groove being formed in the insulation layer at a position corresponding to a gap between adjacent signal lines; a planarization layer at a side of the insulation layer away from the gate line layer; and an active pattern layer at a side of the planarization layer away from the gate line layer.

17 Claims, 2 Drawing Sheets

(51) Int. Cl.
    *H10K 59/124*     (2023.01)
    *H10K 71/00*     (2023.01)

(56) References Cited

U.S. PATENT DOCUMENTS

| | | | |
|---|---|---|---|
| 12,022,699 B2* | 6/2024 | Eom | H01L 24/05 |
| 2014/0117320 A1* | 5/2014 | Jung | H10K 59/131 |
| | | | 257/40 |
| 2018/0211982 A1* | 7/2018 | Wang | G02F 1/136259 |
| 2019/0267410 A1 | 8/2019 | Peng et al. | |
| 2019/0386032 A1* | 12/2019 | Hsu | H10K 59/131 |
| 2020/0066827 A1* | 2/2020 | Lhee | G09G 3/3233 |
| 2021/0210686 A1* | 7/2021 | Sung | H10K 59/122 |
| 2024/0038771 A1* | 2/2024 | Yu | H01L 27/1248 |

\* cited by examiner

DISPLAY SUBSTRATE, MANUFACTURING METHOD AND DISPLAY DEVICE

CROSS-REFERENCE TO RELATED APPLICATION

This application is the U.S. national phase of PCT Application No. PCT/CN2021/100059 filed on Jun. 15, 2021, and claims a priority of the Chinese patent application No. 202010542855.2 filed on Jun. 15, 2020, which is incorporated herein by reference in its entirety.

TECHNICAL FIELD

The present disclosure relates to the field of display technology, in particular to a display substrate, a manufacturing method thereof, and a display device.

BACKGROUND

Organic Light-Emitting Diode (OLED) display device has become a promising next-generation display technology due to such advantages as being thin and light, a wide viewing angle, self-luminescence, continuously adjustable color, low manufacture cost, rapid response, low power consumption, a low driving voltage, a wide operating temperature, a simple manufacture process, high luminous efficiency, and being flexible.

For an OLED display product, in order to provide a maximum display region, a narrow bezel needs to be provided. However, in the conventional OLED display product, signal lines are densely arranged at a wiring region with a small distance between the adjacent signal lines, and a gate electrode layer pattern is superimposed on an inorganic film layer, so a groove is formed in a gap between the signal lines when an insulation layer covering the signal lines is formed. Next, when another layer of signal lines is formed on the insulation layer through a conductive material, a residual conductive material is kept in the groove. At this time, a short circuit occurs between the adjacent signal lines, and thereby the yield of a display substrate is adversely affected. In order to ensure the yield of the display substrate, it is necessary to provide a large distance between the signal lines, but at this time, it is adverse to the narrow bezel of the display product.

SUMMARY

The present disclosure provides the following technical solutions.

In one aspect, the present disclosure provides in some embodiments a display substrate, including a display region and a wiring region surrounding the display region. The wiring region includes: a gate line layer including a plurality of signal lines parallel to each other; an insulation layer covering the gate line layer, a groove being formed in the insulation layer at a position corresponding to a gap between adjacent signal lines; a planarization layer at a side of the insulation layer away from the gate line layer; and an active pattern layer at a side of the planarization layer away from the gate line layer.

In a possible embodiment of the present disclosure, the gate line layer includes: a first gate insulation layer on a base substrate; first signal lines made of a first gate metal layer at a side of the first gate insulation layer away from the base substrate; a second gate insulation layer at a side of the first signal line away from the base substrate; and second signal lines made of a second gate metal layer at a side of the second gate insulation layer away from the base substrate. The first signal lines and the second signal lines are parallel to each other and arranged alternately.

In a possible embodiment of the present disclosure, the insulation layer includes the grooves and a protrusion between the adjacent grooves, and a maximum thickness of the planarization layer in a direction perpendicular to the base substrate is not less than a depth of the groove.

In a possible embodiment of the present disclosure, a distance between each first signal line and an adjacent second signal line is less than 10 μm.

In a possible embodiment of the present disclosure, the planarization layer is made of an organic material.

In a possible embodiment of the present disclosure, the active pattern layer includes a source electrode pattern and a drain electrode pattern.

In another aspect, the present disclosure provides in some embodiments a display panel including the above-mentioned display substrate.

In yet another aspect, the present disclosure provides in some embodiments a display device including the above-mentioned display panel.

In still yet another aspect, the present disclosure provides in some embodiments a method for manufacturing a display substrate. The display substrate includes a display region and a wiring region surrounding the display region. The method includes: forming a gate line layer at the wiring region, the gate line layer including a plurality of signal lines parallel to each other; forming an insulation layer covering the gate line layer, a groove being formed in the insulation layer at a position corresponding to a gap between the adjacent signal lines; forming a planarization layer at a side of the insulation layer away from the gate line layer; and forming an active pattern layer at a side of the planarization layer away from the gate line layer.

In a possible embodiment of the present disclosure, the forming the gate line layer includes: forming a first gate insulation layer on a base substrate; forming first signal lines through a first gate metal layer at a side of the first gate insulation layer away from the base substrate; forming a second gate insulation layer at a side of the first signal line away from the base substrate; and forming second signal lines through a second gate metal layer at a side of the second gate insulation layer away from the base substrate. The first signal lines and the second signal lines are parallel to each other and arranged alternately.

In a possible embodiment of the present disclosure, the forming the planarization layer includes coating an organic material on a surface of the insulation layer away from the gate line layer, and curing the organic material to form the planarization layer. The insulation layer includes the grooves and a protrusion between the adjacent grooves, and a maximum thickness of the planarization layer in a direction perpendicular to the base substrate is not less than a depth of the groove.

In a possible embodiment of the present disclosure, a distance between each first signal line and an adjacent second signal line is less than 10 μm.

In a possible embodiment of the present disclosure, the planarization layer is made of an organic material.

In a possible embodiment of the present disclosure, the active pattern layer includes a source electrode pattern and a drain electrode pattern.

Figure 1:
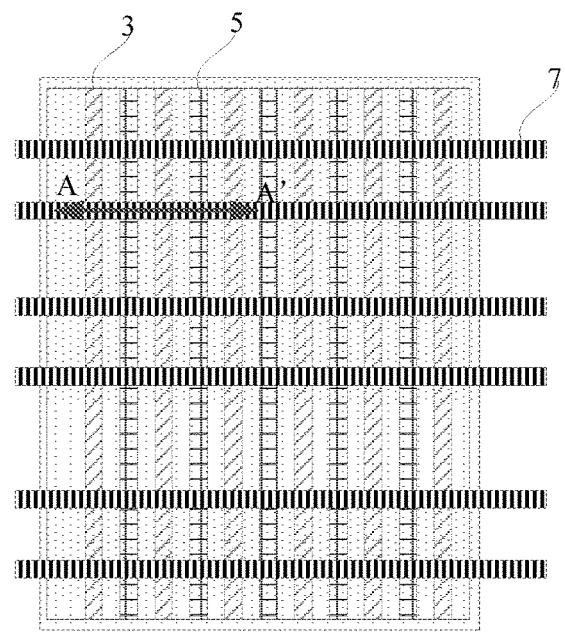
FIG. 1 is a planar view of a wiring region of a display substrate.

REFERENCE SIGN LIST 1 base substrate
2 first gate insulation layer
3 first signal line
4 second gate insulation layer
5 second signal line
6 interlayer insulation layer
7 source/drain metal layer
8 planarization layer
71 residual conductive material

DETAILED DESCRIPTION

In order to make the objects, the technical solutions and the advantages of the present disclosure more apparent, the present disclosure will be described hereinafter in a clear and complete manner in conjunction with the drawings and embodiments.

Figure 2:
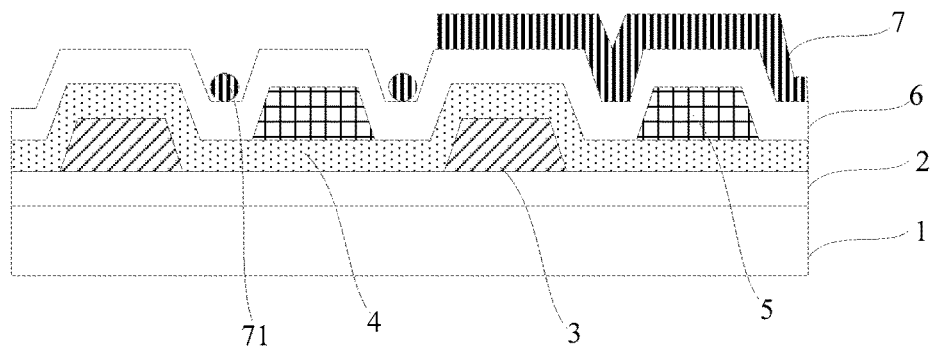
FIG. 2 is a schematic view showing a residual conductive material in a groove in the related art.

For an OLED display product, in order to provide a maximum display region, a narrow bezel needs to be provided. FIG. 1 is a planar view of a wiring region of a display substrate, and FIG. 2 is a sectional view of the display substrate along line AA' in FIG. 1. As shown in FIG. 2, the wiring region of the display substrate includes a base substrate 1, a first gate insulation layer 2 on the base substrate 1, a first signal line 3 made of a first gate metal layer on the first gate insulation layer 2, a second gate insulation layer 4, a second signal line 5 made of a second gate metal layer on the second gate insulation layer 4, an interlayer insulation layer 6, and an active pattern layer made of a source/drain metal layer 7 on the interlayer insulation layer 6.

At the wiring region, the first signal lines 3 and the second signal lines 5 are parallel to each other and arranged alternately. The lines are arranged densely at the wiring region, so a distance between the first signal line 3 and the second signal line 5 is small. After the formation of the second gate insulation layer 4 and the interlayer insulation layer 6, a plurality of grooves is formed in a surface of the interlayer insulation layer 6 away from the base substrate 1. After the formation of the active pattern layer the source/drain metal layer 7, a residual conductive material 71 is kept in the groove. At this time, a short circuit occurs between the adjacent signal lines, and thereby the yield of a display substrate is adversely affected. In order to ensure the yield of the display substrate, it is necessary to provide a large distance between the signal lines, but at this time, it is adverse to the narrow bezel of the display product. In addition, when a short circuit occurs between the adjacent lines at the active pattern layer, such defects as a burn of a display panel, a defective white bar for a conductive pin and poor reliability may easily occur in an aging test.

An object of the present disclosure is to provide a display substrate, a manufacturing method thereof and a display device, so as to achieve a narrow bezel of the display substrate.

The present disclosure provides in some embodiments a display substrate, which includes a display region and a wiring region surrounding the display region. The wiring region includes: a gate line layer including a plurality of signal lines parallel to each other; an insulation layer covering the gate line layer, a groove being formed in the insulation layer at a position corresponding to a gap between adjacent signal lines; a planarization layer at a side of the insulation layer away from the gate line layer; and an active pattern layer at a side of the planarization layer away from the gate line layer.

According to the embodiments of the present disclosure, the planarization layer is arranged at a side of the insulation layer away from the gate line layer, and the active pattern layer is formed on the planarization layer. Due to the formation of the active pattern layer on a flat surface, even if a distance between lines of the active pattern layer is small, there is no residual conductive material between the adjacent lines of the active pattern layer after the formation of the active pattern layer through the conductive material, so it is able to prevent the occurrence of a short circuit between the adjacent lines of the active pattern layer. In this regard, it is able to provide a small distance between the adjacent lines of the active pattern layer, thereby to achieve a narrow bezel of a display device. In addition, it is also able to prevent the occurrence of such defects as a burn of a display panel, a white bar defect of a conductive pin and poor reliability during an aging test.

In the embodiments of the present disclosure, the gate line layer and the active pattern layer are any two adjacent layers of signal lines at the wiring region.

Figure 3:
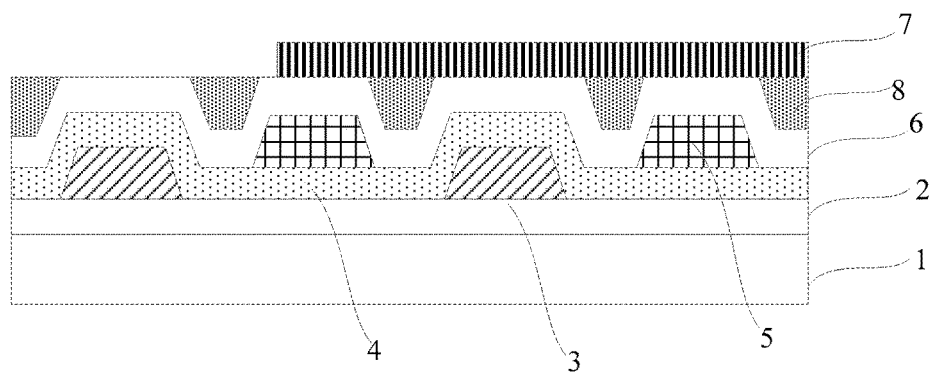
FIG. 3 is a sectional view of a wiring region and a display region according to one embodiment of the present disclosure.
Figure 4:
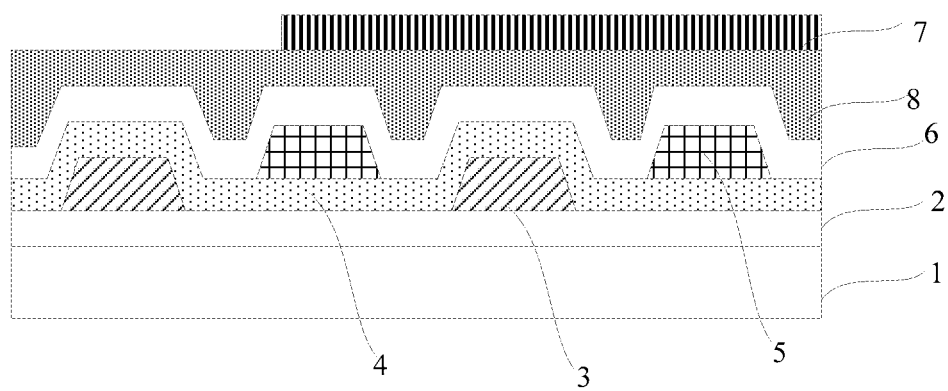
FIG. 4 is another sectional view of the wiring region and the display region according to one embodiment of the present disclosure.

In the embodiments of the present disclosure, as shown in FIG. 3 and FIG. 4, the gate line layer includes: a first gate insulation layer 2 on a base substrate 1; a first signal line 3 made of a first gate metal layer at a side of the first gate insulation layer 2 away from the base substrate 1; a second gate insulation layer 4 at a side of the first signal line 3 away from the base substrate 1; and a second signal line 5 made of a second gate metal layer at a side of the second gate insulation layer 4 away from the base substrate 1. The first signal line 3 and the second signal line 5 are parallel to each other and arranged alternately.

The insulation layer covering the gate line layer may be an interlayer insulation layer 6. As shown in FIG. 3 and FIG. 4, a surface of the interlayer insulation layer 6 at a side away from the base substrate 1 includes grooves and a protrusion between the adjacent grooves, and the planarization layer 8 fills in the grooves to provide a flat surface for the active pattern layer. After the formation of the active pattern layer through the source/drain metal layer 8, there is no residual source/drain metal layer 7 between the adjacent lines of the active pattern layer, so it is able to prevent the occurrence of the short circuit between the adjacent lines of the active pattern layer. In this way, it is able to provide a small distance between the adjacent lines of the active pattern layer, thereby to achieve the narrow bezel of the display device. In some embodiments of the present disclosure, a distance between the first signal line and the adjacent second signal line is less than 10 μm.

In the embodiments of the present disclosure, the gate line layer is made of, but not limited to, the gate metal layer, and the active pattern layer is made of, but not limited to, the source/drain metal layer, i.e., the gate line layer and active pattern layer may also be made of any other metal layers.

The planarization layer 8 may be made of an organic insulation material and may be formed through a coating process. A surface height of a surface of the planarization layer 8 away from the base substrate 1 is not less than a surface height of a surface of the protrusion away from the base substrate 1. In other words, a maximum thickness of the planarization layer in a direction perpendicular to the base substrate is not less than a depth of the groove, i.e., the planarization layer 8 at least completely fills in the groove. In some embodiments of the present disclosure, as shown in FIG. 3, the planarization layer 8 may just fill in the groove, and in other embodiments of the present disclosure, as shown in FIG. 4, the surface height of the planarization layer 8 is greater than the surface height of the surface of the protrusion away from the base substrate 1.

According to the embodiments of the present disclosure, the planarization layer is arranged at a side of the insulation layer away from the gate line layer, and the active pattern layer is formed on the planarization layer. Due to the formation of the active pattern layer on a flat surface, even if the distance between the lines of the active pattern layer is small, there is no residual conductive material between the adjacent lines of the active pattern layer after the formation of the active pattern layer through the conductive material, so it is able to prevent the occurrence of the short circuit between the adjacent lines of the active pattern layer. In this regard, it is able to provide a small distance between the adjacent lines of the active pattern layer, thereby to achieve a narrow bezel of a display device.

The present disclosure further provides in some embodiments a display panel which includes the above-mentioned display substrate.

The present disclosure further provides in some embodiments a display device which includes the above-mentioned display panel.

The display device includes, but not limited to, a radio frequency unit, a network module, an audio output unit, an input unit, a sensor, a display unit, a user input unit, an interface unit, a memory, a processor, and a power source. It should be appreciated that, the display device may not be limited thereto, i.e., it may include more or fewer members, or some members may be combined, or the members may be arranged in different modes. In the embodiments of the present disclosure, the display device may include, but not limited to, display, mobile phone, flat-panel computer, television, wearable electronic device or navigator.

The display device may be any product or member having a display function, such as a television, a display, a digital photo frame, a mobile phone or a tablet computer. The display device further includes a flexible circuit board, a printed circuit board and a back plate.

The present disclosure further provides in some embodiments a method for manufacturing a display substrate. The display substrate includes a display region and a wiring region surrounding the display region. The method includes: forming a gate line layer at the wiring region, the gate line layer including a plurality of signal lines parallel to each other; forming an insulation layer covering the gate line layer, a groove being formed in the insulation layer at a position corresponding to a gap between the adjacent signal lines; forming a planarization layer at a side of the insulation layer away from the gate line layer; and forming an active pattern layer at a side of the planarization layer away from the gate line layer.

According to the embodiments of the present disclosure, the planarization layer is arranged at a side of the insulation layer away from the gate line layer, and the active pattern layer is formed on the planarization layer. Due to the formation of the active pattern layer on a flat surface, even if a distance between lines of the active pattern layer is small, there is no residual conductive material between the adjacent lines of the active pattern layer after the formation of the active pattern layer through the conductive material, so it is able to prevent the occurrence of a short circuit between the adjacent lines of the active pattern layer. In this regard, it is able to provide a small distance between the adjacent lines of the active pattern layer, thereby to achieve a narrow bezel of a display device. In addition, it is also able to prevent the occurrence of such defects as a burn of a display panel, a white bar defect of a conductive pin and poor reliability during an aging test.

In the embodiments of the present disclosure, the gate line layer and the active pattern layer are any two adjacent layers of signal lines at the wiring region.

In some embodiments of the present disclosure, as shown in FIG. 3 and FIG. 4, the forming the gate line layer includes the following steps.

At first, the first gate insulation layer 2 is formed on the base substrate 1. The base substrate 1 is a glass substrate or a quartz substrate. To be specific, the first gate insulation layer 2 with a thickness of 500 Å to 5000 Å is deposited on the base substrate 1 through a Plasma Enhanced Chemical Vapor Deposition (PECVD) method, and the first gate insulation layer 2 is made of an oxide, a nitride, or an oxynitride.

Next, the first signal lines 3 are formed through a first gate metal layer at a side of the first gate insulation layer away from the base substrate. To be specific, the first gate metal layer with a thickness of about 500 Å to 4000 Å is deposited through sputtering or thermal evaporation, and the first gate material layer may be made of Cuprum (Cu), Aluminium (Al), Argentum (Ag), Molybdenum (Mo), Chromium (Cr), Neodymium (Nd), Nickel (Ni), Manganese (Mn), Titanium (Ti), Tantalum (Ta), Tungsten (W), or an alloy thereof. The first gate metal layer may have a single-layer structure or a multi-layer structure, such as Cu\Mo, Ti\Cu\Ti, or Mo\Al\Mo. A photoresist is coated on the first gate metal layer, and exposed through a mask to form a photoresist reserved region corresponding to a region where a pattern of the first signal lines 3 is located, and a photoresist unreserved region corresponding to a region other than the pattern. Next, a developing process is performed so as to completely remove the photoresist at the photoresist unreserved region and maintain a thickness of the photoresist thickness at the photoresist reserved region. Then, the first gate metal layer at the photoresist unreserved region is fully etched through an etching process, and the remaining photoresist is removed, so as to form the pattern of the first signal line 3.

Next, the second gate insulation layer is formed at a side of the first signal line 3 away from the base substrate 1. To be specific, the second gate insulation layer 4 with a thickness of 500 Å to 5000 Å is deposited on the base substrate 1 through a PECVD method, and the second gate insulation layer 4 may be made of an oxide, a nitride, or an oxynitride.

Finally, the second signal line 5 is formed through a second gate metal layer at a side of the second gate insulation layer away from the base substrate 1. The first signal line 3 and the second signal line 5 are parallel to each other and arranged alternately. To be specific, the second gate metal layer with a thickness of about 500 Å to 4000 Å is deposited through sputtering or thermal evaporation, and the second gate material layer may be made of Cu, Al, Ag, Mo, Cr, Nd, Ni, Mn, Ti, Ta, W or an alloy thereof. The second gate metal layer may have a single-layer structure or a multi-layer structure, such as Cu\Mo, Ti\Cu\Ti, or Mo\Al\Mo. Next, a photoresist is coated on the second gate metal layer, and exposed through a mask to form a photoresist reserved region corresponding to a region where a pattern of the second signal lines 5 is arranged, and a photoresist unreserved region corresponding to a region other than the pattern. Next, a developing process is performed, so as to completely remove the photoresist at the photoresist unreserved region, and maintain a thickness of the photoresist thickness at the photoresist reserved region. Then, the second gate metal layer at the photoresist unreserved region is fully etched through an etching process, and the remaining photoresist is removed, so as to form the pattern of the second signal lines 5.

In the embodiments of the present disclosure, the gate line layer is made of, but not limited to, the gate metal layer, and the active pattern layer is made of, but not limited to, the source/drain metal layer, i.e., the gate line layer and active pattern layer may also be made of any other metal layers.

In some embodiments of the present disclosure, the forming the planarization layer include coating an organic material on a surface of the insulation layer away from the gate line layer, and curing the organic material to form the planarization layer. The insulation layer includes the grooves and a protrusion between the adjacent grooves, and a maximum thickness of the planarization layer in a direction perpendicular to the base substrate is not less than a depth of the groove.

The insulation layer covering the gate line layer may be the interlayer insulation layer 6. As shown in FIG. 3 and FIG. 4, a surface of the interlayer insulation layer 6 at a side away from the base substrate 1 includes grooves and a protrusion between the adjacent grooves, and the planarization layer 8 fills in the grooves to provide a flat surface for the active pattern layer. After the formation of the active pattern layer through the source/drain metal layer 8, there is no residual source/drain metal layer 7 between the adjacent lines of the active pattern layer, so it is able to prevent the occurrence of the short circuit between the adjacent lines of the active pattern layer. In this way, it is able to provide a small distance between the adjacent lines of the active pattern layer, thereby to achieve the narrow bezel of the display device. In some embodiments of the present disclosure, a distance between the first signal line and the adjacent second signal line is less than 10 μm.

In some embodiments of the present disclosure, as shown in FIG. 3, the planarization layer 8 may just fill in the groove, and in other embodiments of the present disclosure, as shown in FIG. 4, the surface height of the planarization layer 8 is greater than the surface height of the surface of the protrusion away from the base substrate 1. In other words, a maximum thickness of the planarization layer 8 in a direction perpendicular to the base substrate 1 is not less than a depth of the groove, i.e., the planarization layer 8 at least completely fills in the groove.

In the embodiments of the present disclosure, the order of the steps is not limited to the serial numbers thereof. For a person skilled in the art, any change in the order of the steps shall also fall within the scope of the present disclosure if without any creative effort.

It should be further appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a display region and a wiring region surrounding the display region, wherein the wiring region comprises:
   a gate line layer comprising a plurality of signal lines parallel to each other;
   an insulation layer covering the gate line layer, a groove being formed in the insulation layer at a position corresponding to a gap between adjacent signal lines;
   a planarization layer at a side of the insulation layer away from the gate line layer; and
   an active pattern layer at a side of the planarization layer away from the gate line layer;
   wherein the gate line layer comprises: a first gate insulation layer on a base substrate; first signal lines made of a first gate metal layer at a side of the first gate insulation layer away from the base substrate; a second gate insulation layer at a side of the first signal line away from the base substrate; and second signal lines made of a second gate metal layer at a side of the second gate insulation layer away from the base substrate, wherein the first signal lines and the second signal lines are parallel to each other and arranged alternately.

2. The display substrate according to claim 1, wherein the insulation layer comprises the grooves and a protrusion between the adjacent grooves, and a maximum thickness of the planarization layer in a direction perpendicular to the base substrate is not less than a depth of the groove.

3. The display substrate according to claim 1, wherein a distance between each first signal line and an adjacent second signal line is less than 10 μm.

4. The display substrate according to claim 1, wherein the planarization layer is made of an organic material.

5. The display substrate according to claim 1, wherein the active pattern layer comprises a source electrode pattern and a drain electrode pattern.

6. A display panel, comprising a display substrate, wherein the display substrate comprises a display region and a wiring region surrounding the display region, wherein the wiring region comprises:
   a gate line layer comprising a plurality of signal lines parallel to each other;
   an insulation layer covering the gate line layer, a groove being formed in the insulation layer at a position corresponding to a gap between adjacent signal lines;
   a planarization layer at a side of the insulation layer away from the gate line layer; and
   an active pattern layer at a side of the planarization layer away from the gate line layer;
   wherein the gate line layer comprises: a first gate insulation layer on a base substrate; first signal lines made of a first gate metal layer at a side of the first gate insulation layer away from the base substrate; a second gate insulation layer at a side of the first signal line away from the base substrate; and second signal lines made of a second gate metal layer at a side of the second gate insulation layer away from the base substrate, wherein the first signal lines and the second signal lines are parallel to each other and arranged alternately.

7. A display device, comprising the display panel according to claim 6.

8. A method for manufacturing a display substrate, wherein the display substrate comprises a display region and a wiring region surrounding the display region, and the method comprises:
   forming a gate line layer at the wiring region, the gate line layer comprising a plurality of signal lines parallel to each other;
   forming an insulation layer covering the gate line layer, a groove being formed in the insulation layer at a position corresponding to a gap between the adjacent signal lines;
   forming a planarization layer at a side of the insulation layer away from the gate line layer; and
   forming an active pattern layer at a side of the planarization layer away from the gate line layer;
   wherein the forming the gate line layer comprises: forming a first gate insulation layer on a base substrate; forming first signal lines through a first gate metal layer at a side of the first gate insulation layer away from the base substrate; forming a second gate insulation layer at a side of the first signal line away from the base substrate; and forming second signal lines through a second gate metal layer at a side of the second gate insulation layer away from the base substrate, wherein the first signal lines and the second signal lines are parallel to each other and arranged alternately.

9. The method according to claim 8, wherein the forming the planarization layer comprises coating an organic material on a surface of the insulation layer away from the gate line layer, and curing the organic material to form the planarization layer, wherein the insulation layer comprises the grooves and a protrusion between the adjacent grooves, and a maximum thickness of the planarization layer in a direction perpendicular to the base substrate is not less than a depth of the groove.

10. The method according to claim 8, wherein a distance between each first signal line and an adjacent second signal line is less than 10 µm.

11. The method according to claim 8, wherein the planarization layer is made of an organic material.

12. The method according to claim 8, wherein the active pattern layer comprises a source electrode pattern and a drain electrode pattern.

13. The display panel according to claim 6, wherein the gate line layer comprises: a first gate insulation layer on a base substrate; first signal lines made of a first gate metal layer at a side of the first gate insulation layer away from the base substrate; a second gate insulation layer at a side of the first signal line away from the base substrate; and second signal lines made of a second gate metal layer at a side of the second gate insulation layer away from the base substrate, wherein the first signal lines and the second signal lines are parallel to each other and arranged alternately.

14. The display panel according to claim 13, wherein the insulation layer comprises the grooves and a protrusion between the adjacent grooves, and a maximum thickness of the planarization layer in a direction perpendicular to the base substrate is not less than a depth of the groove.

15. The display panel according to claim 13, wherein a distance between each first signal line and an adjacent second signal line is less than 10 µm.

16. The display panel according to claim 6, wherein the planarization layer is made of an organic material.

17. The display substrate according to claim 6, wherein the active pattern layer comprises a source electrode pattern and a drain electrode pattern.

* * * * *